United States Patent
Quilter et al.

(10) Patent No.: US 9,543,913 B2
(45) Date of Patent: Jan. 10, 2017

(54) PROGRAMMABLY CONFIGURED SWITCHMODE AUDIO AMPLIFIER

(71) Applicant: QSC Audio Products, LLC, Costa Mesa, CA (US)

(72) Inventors: Patrick H. Quilter, Costa Mesa, CA (US); Manny Rodriquez, Costa Mesa, CA (US); Laura Mercs, Huntington Beach, CA (US); Dale Sandberg, Irvine, CA (US); Matthew Skogmo, Placentia, CA (US)

(73) Assignee: OSC, LLC, Costa Mesa, CA (US)

( * ) Notice: Subject to any disclaimer, the term of this patent is extended or adjusted under 35 U.S.C. 154(b) by 601 days.

(21) Appl. No.: 13/777,975

(22) Filed: Feb. 26, 2013

(65) Prior Publication Data
US 2014/0192989 A1 Jul. 10, 2014

Related U.S. Application Data

(60) Provisional application No. 61/750,744, filed on Jan. 9, 2013.

(51) Int. Cl.
| | |
|---|---|
| H03F 1/14 | (2006.01) |
| H03F 3/68 | (2006.01) |
| H03F 1/02 | (2006.01) |
| H03F 3/217 | (2006.01) |
| H03F 3/72 | (2006.01) |
| H03F 3/187 | (2006.01) |

(52) U.S. Cl.
CPC .............. *H03F 3/68* (2013.01); *H03F 1/0277* (2013.01); *H03F 3/187* (2013.01); *H03F 3/2173* (2013.01); *H03F 3/2178* (2013.01); *H03F 3/72* (2013.01); *H03F 2200/03* (2013.01); *H03F 2200/321* (2013.01)

(58) Field of Classification Search
CPC ........................................................ H03F 1/08
USPC ..................................................... 381/28, 57
See application file for complete search history.

(56) References Cited

U.S. PATENT DOCUMENTS

| | | | |
|---|---|---|---|
| 5,729,174 A | 3/1998 | Dunnebacke et al. | |
| 5,875,250 A | 2/1999 | Kuo et al. | |
| 7,852,150 B1* | 12/2010 | Arknaes-Pedersen | 330/10 |
| 7,929,718 B1* | 4/2011 | Gephardt et al. | 381/120 |

(Continued)

OTHER PUBLICATIONS

International Search Report and Written Opinion for International App. No. PCT/US2014/010925, mailed Jul. 21, 2014, 13 pages.

(Continued)

*Primary Examiner* — Duc Nguyen
*Assistant Examiner* — Phan Le
(74) *Attorney, Agent, or Firm* — Perkins Coie LLP

(57) ABSTRACT

A multi-channel switchmode audio amplifier is configured by a programmed processor such that each channel drives separate loads, is connected in parallel or is configured in a bridge-tied mode as well as combinations thereof. In one embodiment, amplifier channels that are connected in parallel have power amplifiers that are driven with signals from a single modulator. A feedback circuit and error amplifier from one channel controls the modulated signal that is applied to each parallely connected amplifier channel. Current feedback circuits for parallely connected amplifier channels are eliminated by tightly controlling the timing of switching in the power amplifier output stages.

25 Claims, 7 Drawing Sheets

(56) References Cited

U.S. PATENT DOCUMENTS

| | | |
|---|---|---|
| 7,986,187 B1 | 7/2011 | Nussbaum et al. |
| 8,922,278 B2 | 12/2014 | Nussbaum et al. |
| 2005/0068098 A1 | 3/2005 | Kirn et al. |
| 2005/0239396 A1* | 10/2005 | Kreifeldt ................ H04H 60/04 455/3.01 |
| 2006/0279354 A1* | 12/2006 | Hansen .................... H03F 1/08 330/10 |
| 2007/0009108 A1* | 1/2007 | Furge ............................. 381/86 |
| 2009/0016539 A1 | 1/2009 | Watanabe |
| 2009/0274312 A1 | 11/2009 | Howard et al. |
| 2012/0047435 A1* | 2/2012 | Holladay ............... H04R 27/00 715/716 |

OTHER PUBLICATIONS

"TAS5162, 2×210 Watt Stereo Digital Amplifier Power Stage. Datasheet [online]. Texas Instruments; Oct. 2006; 33 Pages; [retrieved on Sep. 24, 2015]. Retrieved from the Internet: <URL:www.ti.com/lit/ds/symlink/tas5162.pdf>."

* cited by examiner

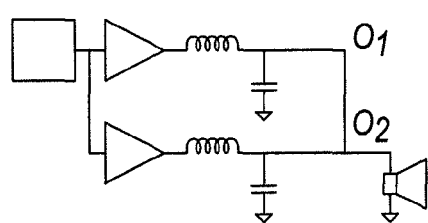
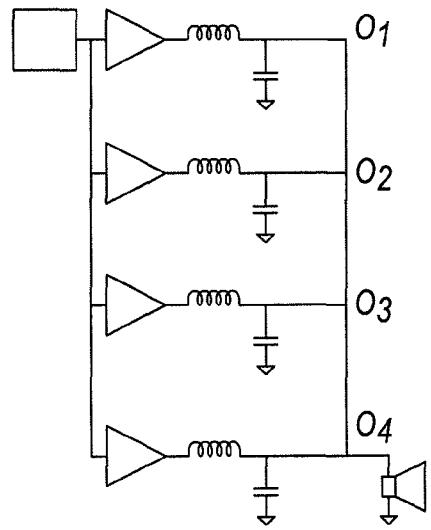
Fig. 4G              Fig. 4H
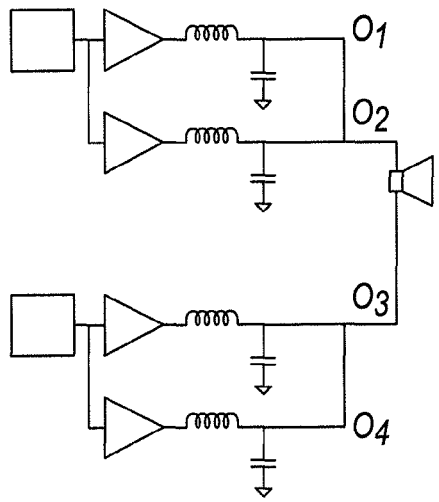
Fig. 4I

PROGRAMMABLY CONFIGURED SWITCHMODE AUDIO AMPLIFIER

CROSS REFERENCE TO RELATED APPLICATION

This non-provisional patent application hereby claims priority to U.S. Provisional Patent Application No. 61/750,744, titled Programmably Configured Audio Amplifier, filed Jan. 9, 2013, which is incorporated herein in its entirety by reference thereto.

TECHNICAL FIELD

The technology disclosed herein relates to switchmode audio amplifiers and in particular to switchmode amplifiers that can drive speakers in various configurations.

BACKGROUND

Unlike home audio equipment that is generally designed to operate in a single speaker configuration, commercial audio equipment is often designed to operate in a number of speaker configurations in order to drive speakers with a wide range of impedances. Commercial amplifiers, which can produce between 500-20,000 watts of power, are often designed to be able to drive multiple speakers in parallel or to drive single speakers (e.g. subwoofers) to high sound pressure levels. Because it is not cost effective to design a single amplifier channel that can drive every different type of load to the same power level, many commercial amplifiers are designed to operate in different modes. These modes can include using one channel to drive one or more speakers, combining the outputs of two or more amplifier channels in parallel to drive one or more speakers or connecting two or more channels to drive speaker(s) in a bridge-tied load or a combination such as a parallel bridge-tied load.

In order to reduce power loss in amplifiers, many commercial audio amplifiers use switching amplifier topologies such as class D designs. When any amplifier channels are connected in parallel, it is difficult to ensure that each channel contributes equally to current delivered to the load. To prevent this, multi-channel amplifier designs often employ special current monitoring feedback circuits that operate to ensure that the current delivered by each channel is the same. Such feedback circuits not only increase the cost of the amplifier designs but are a potential source of error if each feedback circuit in the amplifier does not operate correctly.

Another problem faced by users of commercial audio amplifiers is knowing the best way to connect their speakers to the amplifier. Many users will want to drive various combinations of speakers with different impedances. The user typically has to review tables or charts that list the current and voltage capability of an amplifier channel, the load impedance of various speakers and speaker configurations and other factors in order to determine the best way to drive their speaker loads. The user has to use this information to select a speaker configuration and then determine how to configure the amplifier and connect their speakers to the amplifier in the selected configuration.

Given these problems, there is a need for a multi-channel amplifier design that is less expensive to manufacture, can handle the current sharing problem of amplifier stages driving loads in parallel and can aid the user in determining how to best connect their speakers to the amplifier.

SUMMARY

As will be discussed in further detail below, the disclosed technology relates to a multi-channel switchmode power amplifier where each channel can drive separate speaker loads, can be combined with one or more other channels to drive loads in parallel or can be configured in a bridge-tied load configuration or a combination of such configurations. Each channel includes an error amplifier, a modulator and a power amplifier stage. A number of signal switches are provided in each channel to selectively connect or disconnect an output of a modulator to the power amplifier stage in the channel. Signal switches are also provided to tie the outputs of the power amplifiers stages together in parallel. When operated in parallel, the signal switches are configured by one or more programmed processors to connect the output of a modulator from a master channel to the power amplifier stages of one or more slave channels and to disconnect the modulators in the slave channels. A single feedback control circuit is used to control the output of the modulator for the master channel and no separate feedback controls of the slave channels are needed.

In accordance with another aspect the invention, a programmed processor is configured to receive inputs from a user regarding the number and type of speaker loads to be driven with the amplifier. The processor accesses a database that stores specifications for numerous types of speakers that can be driven. If the database does not include the specifications for the particular type of speaker to be driven, the processor prompts the user to enter the specification information. The processor then determines a configuration of the amplifier channels that will optimally drive the user's speakers. The processor(s) open or close one or more signal switches in the amplifier to achieve the determined configuration and provides instructions to the user regarding how to connect their speakers to the amplifier.

BRIEF DESCRIPTION OF THE DRAWINGS

FIGS. 4A-4I illustrate a number of different amplifier configurations that can be selected by a programmed processor in accordance with an embodiment of the disclosed technology.

DETAILED DESCRIPTION

As will be discussed in further detail below, the technology disclosed herein relates to amplifiers and in particular to switchmode audio amplifiers that can be configured in a number of ways to drive different speaker loads.

Figure 1:
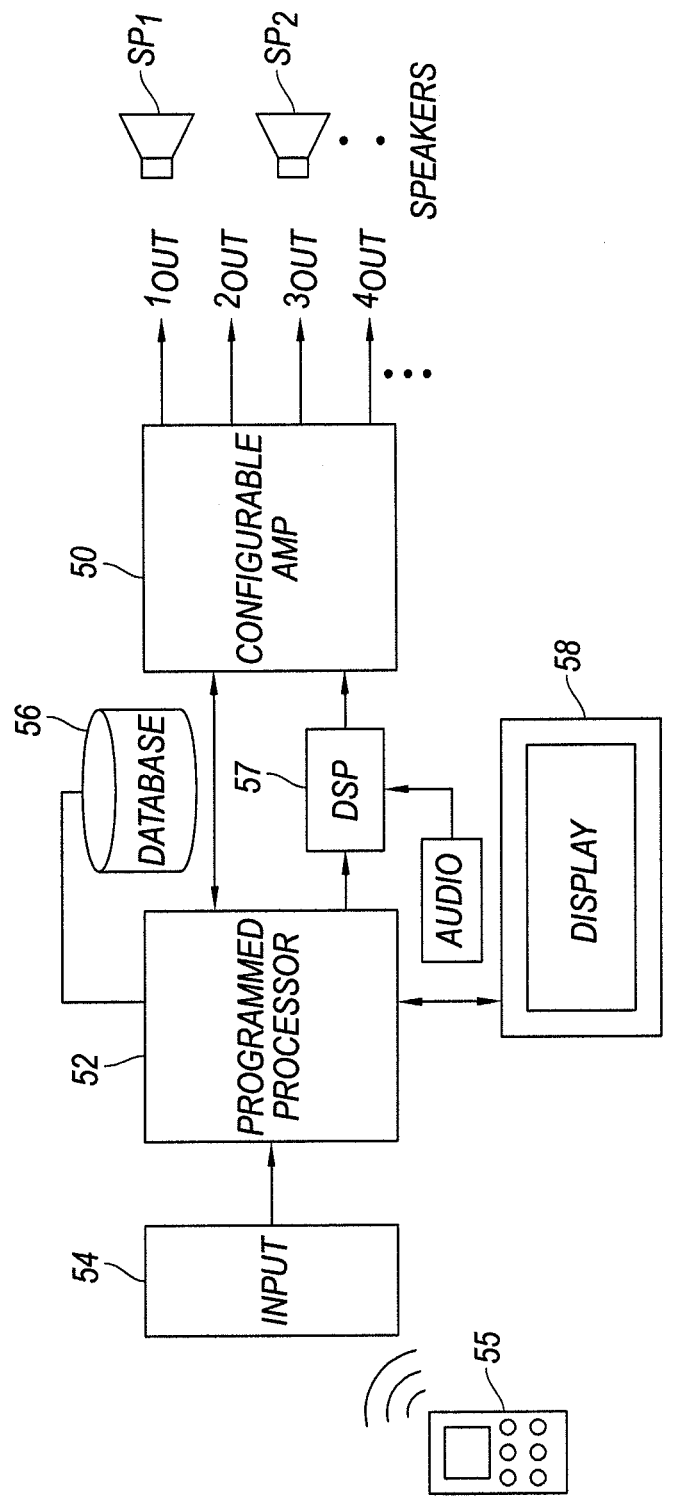
FIG. 1 is a block diagram of a programmably configurable, switchmode power amplifier in accordance with an embodiment of the disclosed technology.

FIG. 1 is a block diagram of a switchmode multi-channel amplifier constructed in accordance with an embodiment of the disclosed technology. In the embodiment shown, a configurable multi-channel amplifier 50 receives an audio input signal and produces amplified audio signals on a number different output channels 1-4. The output channels, shown as $1_{out}$, $2_{out}$, $3_{out}$, $4_{out}$, drive a number of speaker different loads $SP_1$, $SP_2$ etc. In one configuration, each output channel drives a separate speaker load. In another configuration, two or more output channels are coupled together drive a speaker load in parallel. In a third configuration, two or more of the output channels are connected drive a speaker load in a bridge-tied mode configuration. Of course other combinations are possible such as a parallel bridge-tied mode where pairs of parallely connected output channels drive a speaker load in a bridge-tied configuration.

A programmed processor 52 such a microprocessor, FPGA, ASIC or other control circuit is configured to receive information from a user selection via an input 54. The input 54 may be a number of keys or buttons on the amplifier with which the user provides information regarding the speaker load they would like drive. Alternatively, the input 54 can be a port configured to receive signals using a direct wired or wireless connection or from commercially available wired or wireless networks. A remote control 55 can be a dedicated device similar to a hand-held TV remote control or an application program that operates on a general purpose device such as a smartphone, tablet, computer or other convenient platform. In yet another embodiment, the input 54 is a port and associated communication electronics that are configured to receive information from a remote computing device (not shown) via computer communication link such as the Internet.

As indicated above, the programmed processor 52 is configured to receive information from the user regarding the number and type of speakers they wish to drive. The programmed processor accesses a database 56 that stores the specifications for a number of common speaker brands or models. These specifications include at least the impedance of a particular brand/model and its maximum power rating. If the database does not include the specifications for the particular brand/model of speaker to be driven, the programmed processor produces a prompt on a display 58 that asks the user to supply the requested information. In addition, the programmed processor 54 receives or prompts the user for an indication of whether multiple speakers are to be driven in parallel or otherwise in a manner that would change the effective impedance of the speaker load.

From the information provided, the programmed processor 52 determines how the amplifier should be configured to drive the desired number and type of speakers. Some channels may be configured to drive separate speaker loads. Alternatively, two or more channels may be connected drive a speaker load in parallel or two channels may be connected to drive a speaker load in a bridge-tied load configuration or in another combination such as parallel bridge-tied load.

In one embodiment, the programmed processor 52 provides a "connection wizard" that prompts the user with instructions on the display 58 to enter or otherwise provide information regarding the number of speakers they wish to drive as well as their brand/model and impedance. The connection wizard program then determines the appropriate configuration of the amplifier 50 to drive the speakers and sets the position of one or more switches within the amplifier to configure the amplifier in the determined configuration.

In one embodiment, the display 58 is located on the chassis of the amplifier. However the display could also be implemented by sending the instructions via a wired or wireless communication link to a remote device (controller, computer, smart phone etc.).

Figure 2:
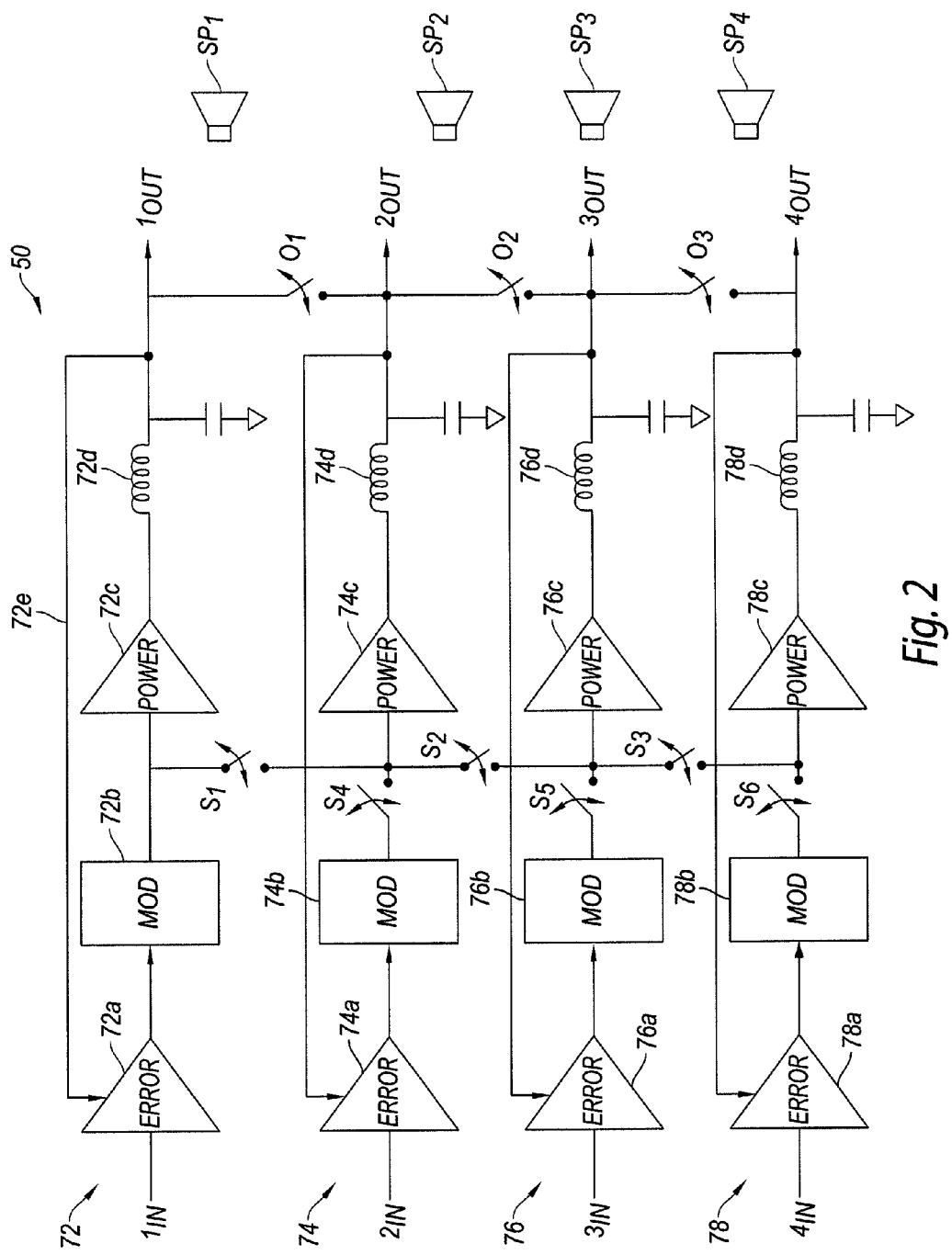
FIG. 2 illustrates a number of signal switches in and between amplifier channels that are selectively opened or closed by a programmed processor in accordance with an embodiment of the disclosed technology.

FIG. 2 is a block diagram of a multi-channel programmable amplifier 50 in accordance with an embodiment of the disclosed technology. In the embodiment shown, there are four amplifier channels labeled as channels 72, 74, 76 and 78. Although four channels are shown in the disclosed embodiment, it will be appreciated that the programmable amplifier 50 could have a greater number (e.g. 8) or a fewer number (e.g. 2) of channels if desired. In the embodiment shown, each channel includes the same major components so only one channel need be described.

Each channel, such as the channel 72, includes an error amplifier 72a, a modulator 72b, a power amplifier stage 72c and a filter circuit 72d. The error amplifier 72a has one input that receives an input signal to be amplified and another input that receives a sample of the output signal of the amplifier channel via a feedback loop 72e. The output of the error amplifier 72a is applied to an input of the modulator 72b. In one embodiment, the modulator 72b is a pulse width modulator. The output of the modulator 72b is provided to an input of the power amplifier stage 72c. The output of the power amplifier stage 72c is fed through an inductor/capacitor (LC) filter circuit 72d that is in turn connected to a speaker terminal (not shown). The feedback loop 72e couples a sample of the output of the amplifier channel back to an input of the error amplifier 72a to control the signal that is applied to the input of the modulator 72b.

In the embodiment shown, a number of signal switches $S_1$-$S_3$ selectively connect the inputs of the power amplifiers stages together. A switch $S_1$ connects the input of the amplifier stage 72c to the input of power amplifier stage 74c. A switch $S_2$ connects the input of the power amplifier stage 74c to the input of the power amplifier stage 76c and a switch $S_3$ connects the input of the amplifier stage 76c to the input of the power amplifier stage 78c.

As will be appreciated, by closing the switch $S_1$, the output of the modulator 72b in channel 72 is supplied to the inputs of both power amplifier stages 72c and 74c. By closing switches S1 and S2, the output of the modulator 72b is supplied to inputs of the power amplifier stages 72c, 74c and 76c etc.

A number of signal switches $S_4$-$S_6$ are provided to selectively connect or disconnect an output of a modulator in a channel from an input of a power amplifier stage in the same channel. For example switch $S_4$ is connected between the output of modulator 74b and an input of the power amplifier stage $74_c$. Switch $S_5$ is connected between the output of modulator 76b and an input of the power amplifier stage 76c. Switch $S_6$ is connected between the output of modulator 78b and an input of the power amplifier stage 78c.

In the embodiment shown, there is no switch between the output of the modulator 72b and the input of the power amplifier stage 72c. Therefore, when operated in parallel, the channel 72 always operates as a master channel (i.e. supplied the signal to drive the power amplifier stages). However, a switch could be provided if desired so that other channels could operate as the master channel.

Signal switches $0_1$-$0_3$ selectively connect the outputs of the power amplifier stages together. Specifically switch $O_1$ connects the output of power amplifier stage 72c to the output of amplifier stage 74c. Switch $O_2$ connects the output of power amplifier stage 74c to the output of amplifier stage 76c. Switch $O_3$ connects the output of power amplifier stage 76c to the output of amplifier stage 78c.

In one embodiment, the signal switches $S_1$-$S_6$ are digitally controlled CMOS switches controlled by the programmed processor. The output signal switches $O_1$-$O_3$ are relays (either mechanical or electronic) with sufficient current carrying capability to handle the currents produced by each power amplifier stage.

As will be appreciated by those skilled in the art, the multi-channel amplifier circuit also includes inverting circuits or programmed software, (which can be done in within a DSP 57) that invert a signal applied to different channels that drive a speaker load in a bridge-tied load configuration.

The position of the switches (and whether signal inversion is performed) is controlled based on signals supplied by the programmed processor 52. As indicated above, the connection wizard program determines the most appropriate amplifier configuration based on the number of speakers to be driven, their impedance and power handling capability. The programmed processor controls the position of the switches in the amplifier and provides instructions to the user regarding how to connect the speakers to the outputs of the amplifiers.

Depending on the type of speaker load to be driven, any of the channels in the amplifier can operate as stand alone channels, can be connected in parallel or can be configured in a bridge-tied load configuration. If the channels are to be connected in parallel, one or more of the output signal switches $O_1$-$O_3$ between the channels are closed. In addition, the output from the modulator of the master channel is connected to the inputs of the power amplifier stages for the slave channel(s). For example, if channel 72 is designated as the master channel to be connected in parallel with the slave channel 74, then the output switch $0_1$ is closed to connect the outputs of the power amplifier stages 72c, 74c together. The switch $S_1$ is closed to connect the output of modulator 72b to the input of the power amplifier stage 74c and the switch $S_4$ is opened to disconnect the output of the modulator 74b from reaching the input of the power amplifier stage 74c.

Because the switch $S_4$ is open, the power amplifier stage for the slave channel is no longer controlled by the feedback loop 74e and the error amplifier 74a. In known multi-channel amplifiers, additional feedback loops are provided to prevent parallely connected amplifier channels from becoming mismatched in the current they provide to the load. However, the disclosed amplifier avoids the need to provide these additional feedback circuits by carefully controlling the driving signals applied to the power amplifier stages.

Figure 3:
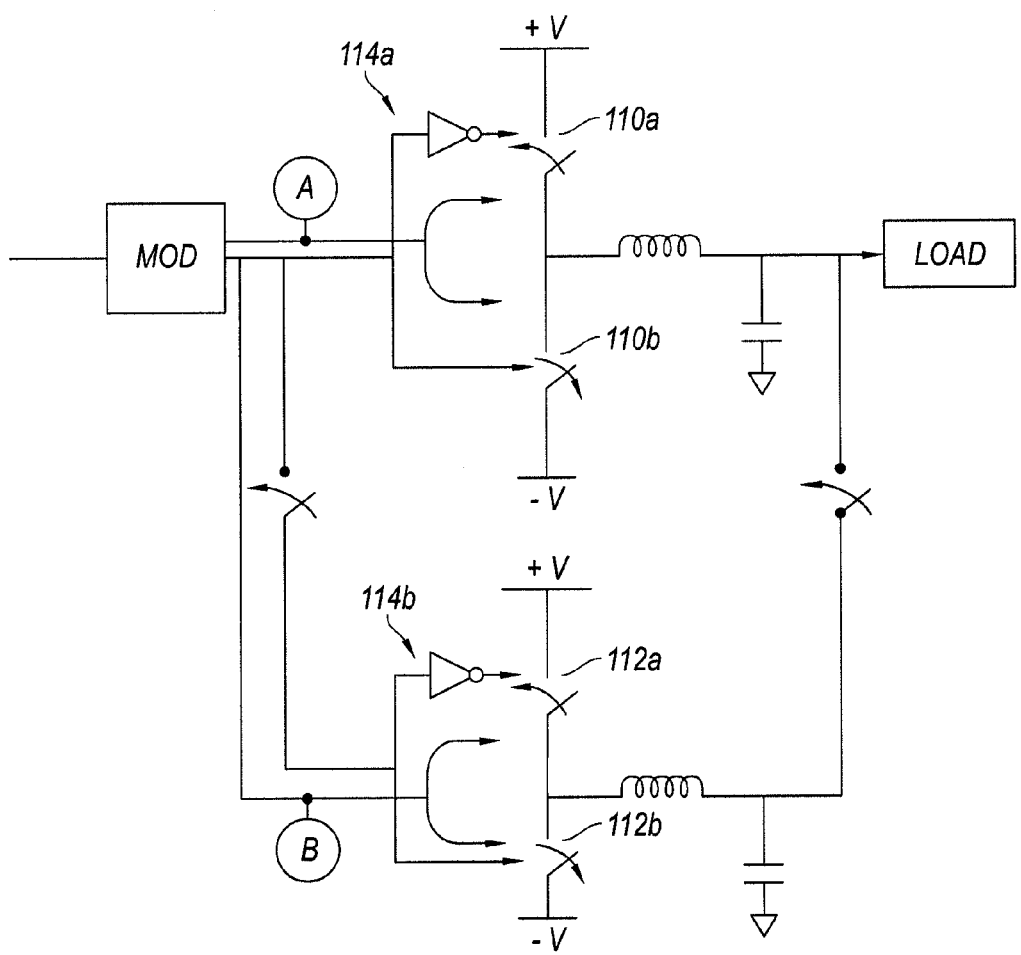
FIG. 3 illustrates how current sharing between amplifier channels is controlled in accordance with an embodiment of the disclosed technology.

FIG. 3 shows a portion of a pair of half bridge amplifier stages that are connected in parallel. Each stage has a pair of Class-D switching transistors 110a, 110b, 112a, 112b that control how current flows through the stages. When transistor 110a is closed or conducting, current flows one way through the load and transistor 110b is open or non-conducting. The Class-D switches then alternate so that transistor 110b is closed while transistor 110a is open so that current flows the other way through the load. Each pair of transistors is controlled by a gate driver 114a, 114b.

If the bridge circuits are connected in parallel and are operating correctly, Class-D switches 110a and 112a should open and close at almost exactly the same time. Similarly, switches 110b, 112b should open and close at almost exactly the same time. If however, the timing of the Class-D switches becomes mismatched, then it is possible that switch 110a could be closed at the same time that switch 112b is closed. Similarly switch 112a may be closed at the same time that switch 110b is closed. The result is a short circuit that causes one amplifier stage to conduct more current than the other stage over the on/off cycle of the half bridge circuit.

One embodiment of the disclosed technology eliminates the need for current feedback circuits in the amplifier by controlling the timing of the switches in each power amplifier stage to open or close (conduct or stop conducting) within 100 ns of each other and more preferably to within 60 ns of each other. Such tight control is achieved by careful layout and by using fast switching transistors and gate drivers in the power amplifier stages. In one embodiment, the switching transistors 110a, 110b, 112a, 112b of the half bridges circuits are mosfets, while the gate drivers are configured to have low propagation delay and isolated outputs.

In addition, the traces on the circuit boards of the amplifier are arranged so that any differences in the signal delay from the output of the modulator of the master channel to the power amplifier stages of the slave channels are minimized.

Because the timing difference in the switching signals to the switching transistors and gate drivers is tightly controlled, any difference in the current conducted between the parallely connected stages is buffered by the inductors of the filter sections. Because current cannot instantaneously change through either inductor, the actual current supplied by each half bridge circuit is kept nearly the same without the use of current control feedback circuitry.

Because the current control loops normally required to equalize the current between the parallely connected power amplifier stages have been eliminated, the cost to manufacture each switchmode amplifier channel is reduced. In addition, having only a single feedback loop associated with the master channel to control multiple switchmode amplifier stages eliminates potential sources of circuit instability.

With four channels there are 15 different ways that various speaker loads can be connected. If more channels are present in the switchmode power amplifier, (e.g. 8 channels) then there are substantially more connection configurations that are possible. In one embodiment, the connection wizard only provides instructions for the most commonly used speaker connections. FIGS. 4A-4H show examples of these common configurations for a four channel amplifier embodiment.

Figure 4A:
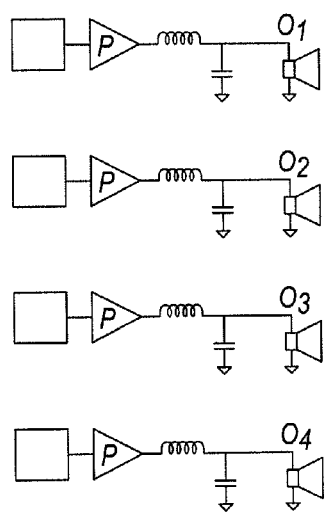

In FIG. 4A, the amplifier channel outputs $O_1$-$O_4$ drive four separate speaker loads.

Figure 4B:
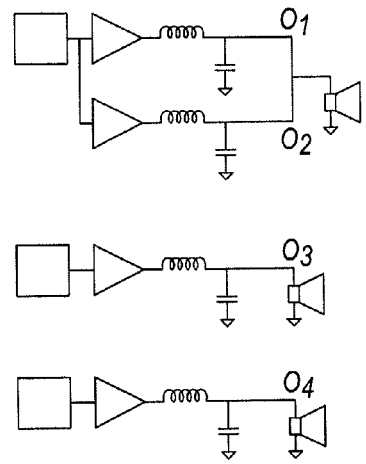

In FIG. 4B, the amplifier channel outputs $O_1$ and $O_2$ are connected in parallel to drive a single speaker load, while the channel outputs $O_3$ and $O_4$ drive separate speaker loads.

Figure 4C:
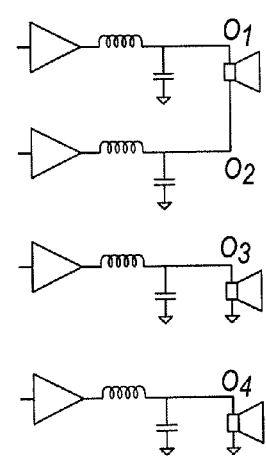

In FIG. 4C, the channel outputs $O_1$ and $O_2$ connect to a single speaker load in a bridge-tied load configuration, while the channel outputs $O_3$ and $O_4$ drive separate speaker loads.

Figure 4D:
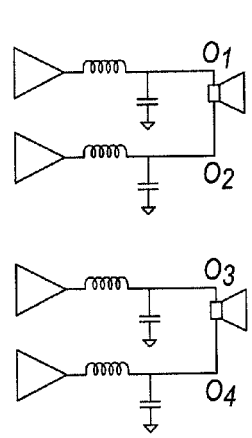

In FIG. 4D, the channel outputs $O_1$ and $O_2$ are connected in a bridge-tied load configuration to drive a single load. Channels outputs $O_3$ and $O_4$ are also connected in a bridge-tied load configuration to drive a single speaker load.

Figure 4E:
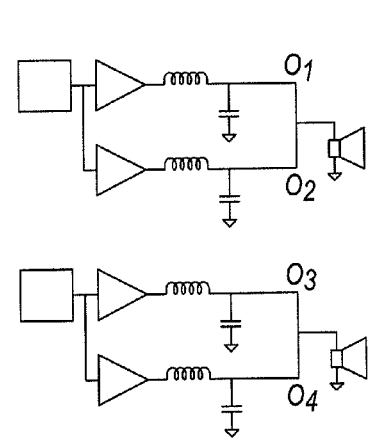

In FIG. 4E, the channel outputs $O_1$ and $O_2$ are connected in parallel to drive a single load. Channel outputs $O_3$ and $O_4$ are also connected in parallel to drive a single speaker load. As used herein "single speaker load" refers to the fact that a single amplifier channel drives one or more speakers and the single speaker load may itself contain one or more speakers.

Figure 4F:
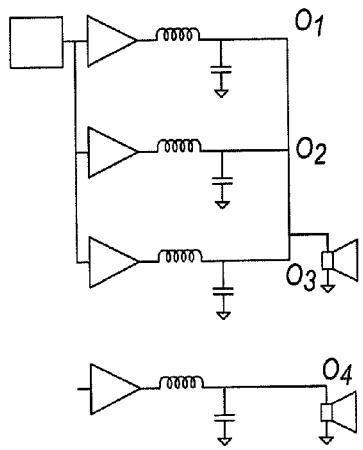

In FIG. 4F, the channel outputs $O_1$-$O_3$ are connected in parallel to a single speaker load, while the channel output $O_4$ is connected to a separate speaker load.

In FIG. 4G, channel outputs $O_1$ and $O_2$ are connected in parallel to a single speaker load, while channel outputs $O_3$ and $O_4$ are connected in a bridge-tied load configuration to drive a single speaker load.

In FIG. 4H, the amplifier is configured such that channel outputs $O_1$-$O_4$ are all connected in parallel to a single speaker load.

Finally, in FIG. 4I, the channel outputs $O_1$ and $O_2$ are connected in parallel, channel outputs $O_3$ and $O_4$ are connected in parallel and the pair of parallel channels are connected to a single speaker load in a bridge-tied load configuration.

Figure 5A:
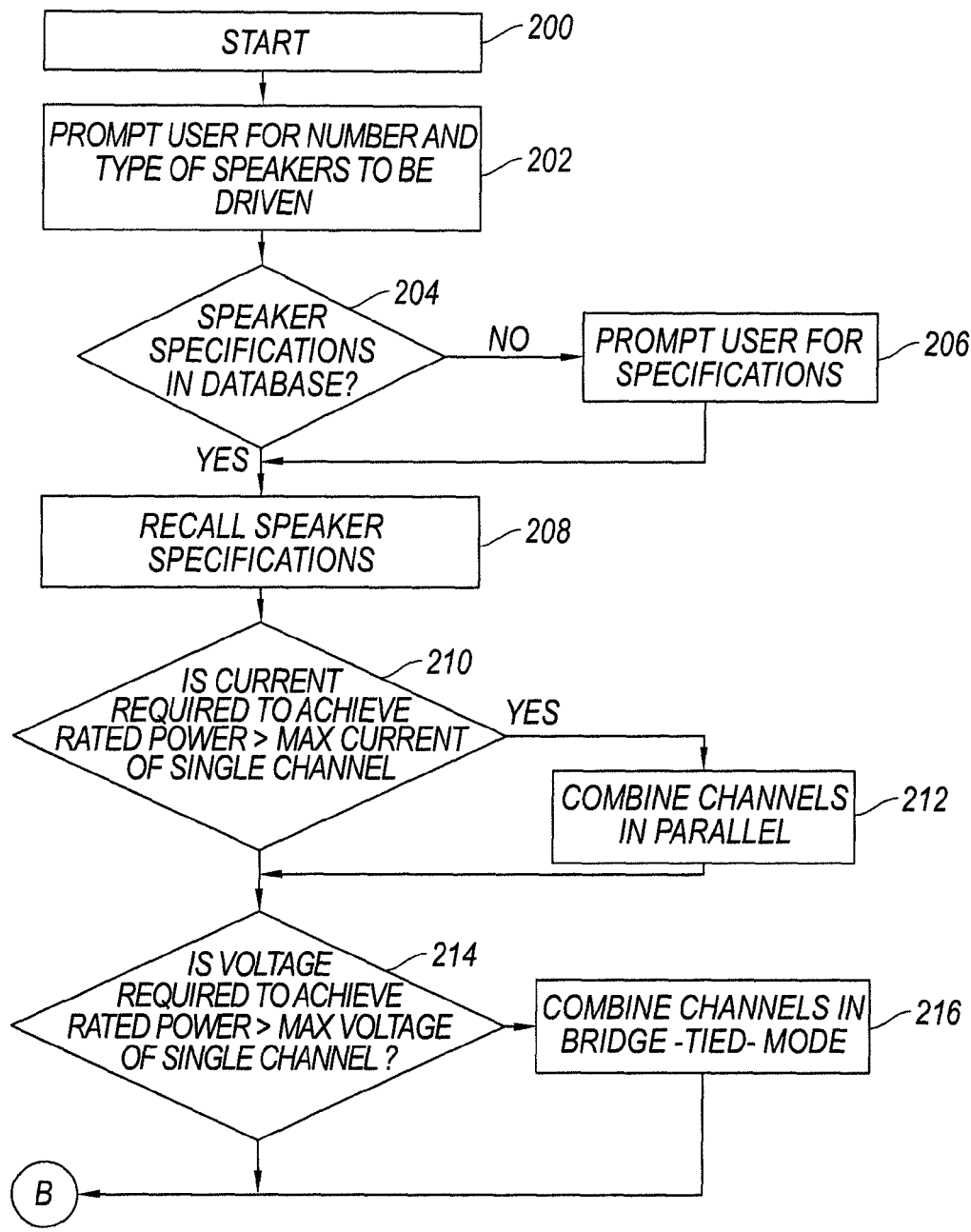
FIGS. 5A-5B illustrate a flow diagram of steps performed by a programmed processor to configure an amplifier to drive a desired speaker load in accordance with an embodiment of the disclosed technology.
Figure 5B:
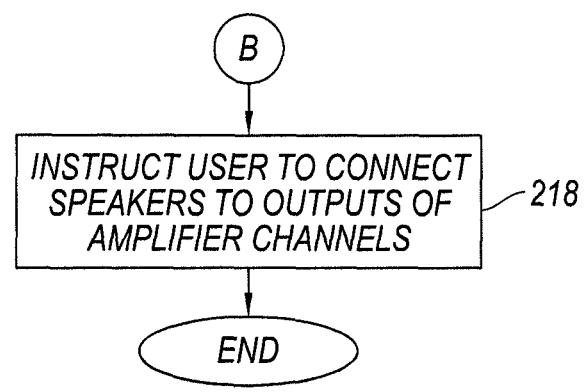

FIGS. 5A-5B show a flow diagram of steps performed by a programmed processor to configure an amplifier in order to drive one or more speakers as requested by the user. As will be understood by those skilled in the art, a processor, computer or the like executes a series of program instructions stored in a non-transitory computer readable media such a flash memory, hard drive, CD ROM or the like. The instructions cause the microprocessor to prompt the user for information about what type of speakers they want to drive with the amplifier. After receiving the speaker information, the programmed processor configures the amplifier in a way that will most appropriately drive the described load. Although the steps are described in particular order for ease of explanation, it will be appreciated that the steps could be performed in a different order or different steps could be performed to achieve the functionality described.

Beginning at 200, the programmed processor prompts the user for the number and type of speakers to be driven by the amplifier at 202. The user can enter the number of speakers to be driven together (e.g. 1-10 speakers in parallel), their brand name and model number. At 204, the processor looks in a database to determine if the speaker specifications (e.g. impedance and maximum power capacity) are listed in the database. If not, the programmed processor prompts the user to provide the specification information at 206. At 208, the programmed processor recalls the speaker specification information. At 210, the programmed processor determines if the current required to drive the speaker(s) to their rated maximum is greater than the maximum current that can be produced by a single switchmode amplifier channel. If so, the programmed processor activates the internal signal switches in the amplifier to combine two or more amplifier channels in parallel at 212.

At 214, the programmed processor determines if the voltage required to drive the speaker(s) to their maximum power rating exceeds the maximum voltage that can be produced from a single channel. If so, the programmed processor activates sets the position of one or more signal switches in the amplifier to operate two or more channels in a bridge-tied load configuration at 216.

At 218, the programmed processor provides instructions to the user that indicate how the speakers should be connected to the outputs of the amplifiers. In some cases the speaker load requested by the user may exceed the capabilities of the amplifier in which case, the programmed processor prompts the user to change their desired speaker configuration.

From the foregoing, it will be appreciated that specific embodiments of the invention have been described herein for purposes of illustration, but that various modifications may be made without deviating from the spirit and scope of the invention. Accordingly, the invention is not limited except as by the appended claims.

We claim:

1. A multi-channel amplifier, comprising:
an input configured to receive information about a desired speaker load;
a number of amplifier channels for driving speaker loads, each amplifier channel including:
an error amplifier;
a modulator; and
a power amplifier stage;
a number of switches configured to selectively connect an output of the modulator of one amplifier channel to an input of the power amplifier stage of one or more other amplifier channels and to selectively connect outputs of the power amplifier stages of two or more amplifier channels together;
a programmed processor that is configured to:
receive information from the input regarding an impedance and maximum power for one or more speakers in the desired speaker load to be driven by the amplifier;
determine a configuration of the amplifier such that one channel of the amplifier drives the desired speaker load, two or more channels of the amplifier are connected in parallel to drive the desired speaker load or two or more channels of the amplifier drive the desired speaker load in a bridge-tied load configuration; and
control the switches in the amplifier so that the amplifier has the determined configuration to drive the desired speaker load.

2. The amplifier of claim 1, wherein the programmed processor is configured to provide instructions to the user indicating how one or more speakers in the desired speaker load are to be connected to the multi-channel amplifier.

3. The amplifier of claim 1, wherein the programmed processor is configured to search a database for speaker specifications based on input received from a user.

4. A multi-channel switchmode audio amplifier, comprising:
a number of amplifier channels, each amplifier channel including an error amplifier, a modulator, a power amplifier stage having switches and gate drivers and a feedback loop from an output of the amplifier channel to an input of the error amplifier of the amplifier channel; and
a programmed processor that is configured to operate the audio amplifier in a parallel mode where one of the amplifier channels is a master channel and one or more of the other amplifier channels is a slave channel by connecting an output of the modulator in the master amplifier channel to inputs of a power amplifier stage of the one or more slave amplifier channels and disconnecting the error amplifier in the feedback loop of the slave amplifier channels from reaching the power amplifier stage of the slave channels, wherein switching differences between the parallely connected power amplifier stages of the master and the one or more slave channels is controlled to within 100 nano seconds.

5. A multi-channel switchmode audio amplifier, comprising:
a number of channels, each including a modulator, a switching power amplifier stage and a feedback loop; and
a programmed processor that is configured to connect two more channels in parallel by connecting an output of a modulator from a master channel to an input of the power amplifier stage for one or more slave channels;

and for disconnecting the feedback loop of each parallely connected slave channel such that current sharing between the master channel and the parallely connected slave channels is controlled based on limiting differences in switching in the power amplifier stages of the parallely connected master and slave channels to within 100 nano seconds.

6. The multi-channel switchmode audio amplifier of claim 5, wherein the power amplifier stages of the slave channels are connectable to the modulator of the master channel with traces on a circuit board that are arranged such that differences in a signal delay between an output of the modulator for the master channel and the power amplifier stages of the master and slave channels are minimized.

7. The multi-channel switchmode amplifier of claim 5, wherein the processor is configured to receive information from the user regarding the impedance and power rating of one or more of the speakers in the desired speaker load.

8. The multi-channel amplifier of claim 1, wherein when two or more channels of the amplifier are connected in parallel one channel is a master channel having a feedback loop and one or more channels are slave channels and wherein feedback for all the parallely connected slave channels is provided by the feedback loop of the master amplifier channel.

9. The multi-channel amplifier of claim 8, wherein the master channel includes a modulator and a power amplifier stage and the slave channels include a power amplifier stage and wherein the power amplifier stages of the slave channels are connectable to the modulator of the master channel with traces on a circuit board that are arranged such that differences in a signal delay between an output of the modulator for the master channel and the power amplifier stages of the master channel and slave channels are minimized.

10. A multi-channel audio amplifier, comprising:
an input configured to receive information regarding a speaker to be driven by the multi-channel amplifier;
a number of amplifier channels for driving speakers, each amplifier channel including:
a modulator; and
a power amplifier stage;
a number of switches configured to selectively connect an output of the modulator of one amplifier channel to an input of the power amplifier stage of one or more other amplifier channels and to selectively connect outputs of the power amplifier stages of two or more amplifier channels together;
a programmed processor that is programmed to:
receive information from the input regarding an impedance and maximum power for a speaker to be driven by the amplifier;
determine from the impedance and maximum power of the speaker to be driven if a current required to drive the speaker to the maximum power exceeds a maximum current that can be produced by an amplifier channel or if a voltage required to drive the speaker to the maximum power exceeds a maximum voltage that can be produced by an amplifier channel in order to determine a configuration of the amplifier so that the speaker is driven by one amplifier channel or by two or more amplifier channels that are connected in parallel or by two or more amplifier channels in a bridge-tied load configuration; and
control the switches in the amplifier so that the amplifier has the determined configuration to drive the speaker.

11. A multi-channel audio amplifier, comprising:
an input configured to receive information about a speaker to be driven by the multi-channel audio amplifier;
a number of amplifier channels for driving speakers;
a programmed processor that is programmed to:
receive information from the input regarding a speaker to be driven by the amplifier;
access a database to determine one or more characteristics of the speaker to be driven;
use the determined one or more characteristics to determine a configuration of the amplifier so that the speaker is driven by one amplifier channel or is driven by two or more amplifier channels that are connected in parallel or is driven by two or more amplifier channels in a bridge-tied load configuration; and
switches within the multi-channel audio amplifier that are controlled by the programmed processor to connect the amplifier channels in the determined configuration to drive the speaker.

12. The multi-channel audio amplifier of claim 11, wherein each of the amplifier channels includes a modulator, a switching power amplifier stage and a switch that connects the modulator of the amplifier channel to the power amplifier stage of the amplifier channel and wherein the processor is programmed to open the switch between the modulator of an amplifier channel and the power amplifier stage when the amplifier channel is connected in parallel with a master amplifier channel in the multi-channel audio amplifier.

13. A multi-channel audio amplifier, comprising:
an input configured to receive information about one or more speakers in a speaker load to be driven by the multi-channel audio amplifier;
a number of amplifier channels for driving speakers, each amplifier channel including:
a modulator; and
a power amplifier stage;
a number of switches for selectively connecting an output of the modulator of one amplifier channel to an input of the power amplifier stage of one or more other amplifier channels and for selectively connecting outputs of the power amplifier stages of two or more amplifier channels together;
a control circuit configured to:
receive information from the input about the one or more speakers to be driven by the amplifier including an impedance and maximum power level of the one or more speakers;
determine from the impedance and maximum power level of the one or more speakers to be driven if a current required to drive the one or more speakers to the entered maximum power level exceeds a maximum current that can be produced by an amplifier channel or if a voltage required to drive the one or more speakers to the entered maximum power level exceeds a maximum voltage that can be produced by an amplifier channel in order to determine a configuration of the amplifier so that the one or more speakers is driven by one amplifier channel or by two or more amplifier channels that are connected in parallel or by two or more amplifier channels that are connected in a bridge-tied load configuration; and
control the switches in the amplifier so that the amplifier has the determined configuration to drive the one or more speakers.

14. The multi-channel amplifier of claim 1, wherein the input is located on a chassis of the multi-channel amplifier and includes buttons or switches used to enter information about the speaker load.

15. The multi-channel amplifier of claim 1, wherein the input is a port that is configured to receive information about the speaker load though a wired communication link.

16. The multi-channel amplifier of claim 1, wherein the input is a port that is configured to receive information about the speaker load through a wireless communication link.

17. The multi-channel audio amplifier of claim 10, wherein the input is located on a chassis of the multi-channel amplifier and includes buttons or switches used to enter information about the speaker load.

18. The multi-channel audio amplifier of claim 10, wherein the input is a port that is configured to receive information about the speaker load through a wired communication link.

19. The multi-channel audio amplifier of claim 10, wherein the input is a port that is configured to receive information about the speaker load through a wireless communication link.

20. The multi-channel audio amplifier of claim 11, wherein the input is located on a chassis of the multi-channel amplifier and includes buttons or switches used to enter information about the speaker load.

21. The multi-channel audio amplifier of claim 11, wherein the input is a port that is configured to receive information about the speaker load through a wired communication link.

22. The multi-channel audio amplifier of claim 11, wherein the input is a port that is configured to receive information about the speaker load through a wireless communication link.

23. The multi-channel audio amplifier of claim 14, wherein the input is located on a chassis of the multi-channel amplifier to receive information about the speaker load.

24. The multi-channel audio amplifier of claim 14, wherein the input is a port that is configured to receive information about the speaker load through a wired communication link.

25. The multi-channel audio amplifier of claim 14, wherein the input is a port that is configured to receive information about the speaker load through a wireless communication link.

\* \* \* \* \*

UNITED STATES PATENT AND TRADEMARK OFFICE
CERTIFICATE OF CORRECTION

PATENT NO. : 9,543,913 B2  
APPLICATION NO. : 13/777975  
DATED : January 10, 2017  
INVENTOR(S) : Quilter et al.

Page 1 of 1

It is certified that error appears in the above-identified patent and that said Letters Patent is hereby corrected as shown below:

In the Claims

Column 12, Line 11, delete "14" and insert -- 13 --, therefor.

Column 12, Line 14, delete "14" and insert -- 13 --, therefor.

Column 12, Line 18, delete "14" and insert -- 13 --, therefor.

Signed and Sealed this  
Fourth Day of April, 2017

Michelle K. Lee  
*Director of the United States Patent and Trademark Office*